United States Patent [19]

Hirose et al.

[11] Patent Number: 5,476,414
[45] Date of Patent: Dec. 19, 1995

[54] POLISHING APPARATUS

[75] Inventors: Masayoshi Hirose; Manabu Tsujimura; Seiji Ishikawa; Norio Kimura; You Ishii, all of Tokyo, Japan

[73] Assignee: Ebara Corporation, Tokyo, Japan

[21] Appl. No.: 124,550

[22] Filed: Sep. 22, 1993

[30] Foreign Application Priority Data

| Sep. 24, 1992 | [JP] | Japan | 4-279344 |
| Sep. 30, 1992 | [JP] | Japan | 4-285366 |
| Sep. 30, 1992 | [JP] | Japan | 4-285367 |

[51] Int. Cl.⁶ .................................................. B24B 7/22
[52] U.S. Cl. ............................. 451/288; 451/388; 451/41
[58] Field of Search ...................... 51/131.4, 131.5, 51/235, 283 R, 215 CP, 215 UE; 451/390

[56] References Cited

U.S. PATENT DOCUMENTS

| 1,217,090 | 2/1917 | Gowlland | 451/540 |
| 1,448,690 | 3/1923 | Hetzer et al. | 51/235 |
| 3,128,580 | 4/1964 | Davis | 51/131.5 |
| 3,579,916 | 5/1971 | Boettcher et al. | 51/131.4 |
| 4,194,324 | 3/1980 | Bonora et al. | 51/131.5 |
| 4,373,991 | 2/1983 | Banks | 156/645 |
| 4,897,966 | 2/1990 | Takahashi | 51/131.5 |
| 4,944,119 | 7/1990 | Gill, Jr. et al. | 51/283 R |
| 4,954,142 | 9/1990 | Carr et al. | 51/309 |
| 5,084,071 | 1/1992 | Nenadic et al. | 51/309 |
| 5,291,692 | 3/1994 | Takahashi et al. | 451/390 |

FOREIGN PATENT DOCUMENTS

| 0156746 | 10/1985 | European Pat. Off. . |
| 0004661 | 1/1986 | Japan | 51/131.4 |
| 62-83949 | 4/1987 | Japan . |
| 0136363 | 6/1987 | Japan | 51/131.4 |
| 4-19065 | 1/1992 | Japan . |
| 2058618 | 4/1981 | United Kingdom . |

OTHER PUBLICATIONS

Patent Abstracts of Japan, vol. 14, No. 32 (E-876) Jan. 22, 1990.
Patent Abstracts of Japan, vol. 6, No. 126 (M-142) Jul. 10, 1992.
Patent Abstracts of Japan, vol. 16, No. 177 (M-1241) Apr. 28, 1992.

*Primary Examiner*—Robert A. Rose
*Attorney, Agent, or Firm*—Wenderoth, Lind & Ponack

[57] ABSTRACT

A workpiece such as a semiconductor wafer is supported on a top ring and polished by an abrasive cloth on a turntable while the top ring is being pressed against the turntable and the turntable and the top ring are being rotated. The top ring is coupled to a top ring drive shaft, coupled to a pressure cylinder for pressing the top ring, and to a motor for rotating the top ring. A spherical bearing is interposed between the top ring and the top ring drive shaft for allowing the top ring to align with the upper surface of the moving turntable. A torque transmitting mechanism is operatively coupled between the top ring and the top ring drive shaft for rotating the top ring in synchronization with the top ring drive shaft.

21 Claims, 15 Drawing Sheets

POLISHING APPARATUS

BACKGROUND OF THE INVENTION

Field of the Invention

The present invention relates to a polishing apparatus, and more particularly to a polishing apparatus for polishing a workpiece such as a semiconductor wafer to a flat mirror finish.

Description of the Related Art

Recent rapid progress in semiconductor device integration demands smaller and smaller wiring patterns or interconnections and also narrower spaces between interconnections which connect active areas. One of the processes available for forming such interconnection is photolithography. Although the photolithographic process can form interconnections that are at most 0.5 μm wide, it requires that surfaces on which pattern images are to be focused on by a stepper be as flat as possible because the depth of focus of the optical system is relatively small.

It is therefore necessary to make the surfaces of semiconductor wafers flat for photolithography. One customary way of flattening the surfaces of semiconductor wafers is to polish them with a polishing apparatus.

Such a polishing apparatus has a turntable and a top ring which rotate at respective individual speeds. An abrasive cloth is attached to the upper surface of the turntable. A workpiece such as a semiconductor wafer to be polished is placed on the abrasive cloth and clamped between the top ring and the turntable. During operation, the top ring exerts a constant pressure on the turntable, and a slurry-like abrasive spray is sprayed from a nozzle over the abrasive cloth. The abrasive spray enters the gap between the abrasive cloth and the workpiece. The surface of the workpiece held against the abrasive cloth is therefore polished while the top ring and the turntable are rotating.

One known polishing device of the above-described type is disclosed in, for example, Japanese laid-open patent publications Nos. 2-278822 and 4-19065. As shown in FIG. 17(a), the polishing device disclosed in Japanese laid-open patent publication No. 2-278822 comprises a drive shaft 81 having a spherical surface 82 at a lower end thereof, and a top ring 84 having a spherical seat 83 which accommodates the spherical surface 82 of the drive shaft 81, whereby the top ring 84 is allowed to follow any tilt in of a turntable surface.

As shown in FIG. 18(a), the polishing device disclosed in Japanese laid-open patent publication No. 4-19065 comprises a drive shaft 91, an intermediate member 92 having a spherical surface 92a fixed to a lower end of the drive shaft 91, and a top ring 94 having a spherical seat 93 which accommodates the spherical surface 92a of the intermediate member 92, whereby the top ring 94 is allowed to follow any tilt in of a turntable surface.

In the conventional polishing apparatuses of the type shown in FIGS. 17(a) and 18(a), the top rings 84, 94 are tiltable with respect to the spherical surfaces 82, 92a as shown in FIGS. 17(b) and 18(b), by the arrow A and rotatable about their own axes as indicated by the arrow B, respectively. That is, the top rings 84, 94 can perform respective single movements indicated by the arrows A and B and a compound movement which is a combination of a movement indicated by the arrow A and a movement indicated by the arrow B, thus following the turntable surface.

As shown in FIG. 19, when the top rings 84, 94 are pressed against the turntable surface 95, which is being tilted from a horizontal plane at an angle a under the force F, respectively, the top rings 84, 94 move by an arc length L with respect to the spherical surfaces 82, 92a, respectively. When the turntable surface undergoes a small tilted movement, the time required for the top ring to move through the arc length L is short. However, when the turntable surface undergoes a large tilted movement locally, the longer the circular arc length L, and the longer the time required for the top ring to move through the arc length L. As a result, the lower surface of the top ring cannot smoothly follow the tilted movement of the turntable surface.

SUMMARY OF THE INVENTION

It is therefore an object of the present invention to provide a polishing apparatus which allows a top ring to smoothly follow tilted movement of a turntable, and can transmit the torque of a top ring drive shaft reliably to the top ring.

According to the present invention, there is provided a polishing apparatus for polishing a surface of a workpiece, comprising: a turntable with an abrasive cloth mounted on an upper surface thereof; a top ring positioned above the turntable for supporting the workpiece to be polished and pressing the workpiece against the abrasive cloth; a top ring drive shaft coupled to a first actuating means for pressing the top ring and coupled to second actuating means for rotating the top ring; and a spherical bearing interposed between the top ring and the top ring drive shaft for allowing the top ring to follow a change in inclination in the surface of the turntable.

The above-described polishing unit comprises three separate members, namely the top ring drive shaft, the spherical bearing and the top ring. Therefore, the top ring can follow the tilted movement of the turntable smoothly and quickly because of a high degree of freedom. The workpiece can thus be polished highly accurately to a flat mirror finish. Since the top ring rotates in synchronization with the top ring drive shaft, the flat mirror finish given to the workpiece is of a stable quality.

The top ring has a plurality of suction holes connected to a vacuum source for holding the workpiece to a lower surface of the top ring under a vacuum developed by the vacuum source. Since the top ring rotates in synchronization with the top ring drive shaft, it is not necessary for the suction hole to be formed centrally in the top ring and aligned with a suction hole formed centrally axially in the top ring drive shaft. Consequently, a vacuum line for developing a vacuum in the top ring to attract the workpiece to the top ring can be designed readily.

The polishing apparatus further comprises torque transmitting means including at least one first pin mounted on the top ring drive shaft and at least one second pin mounted on the top ring, and the first pin and the second pin are held in point contact with each other for transmitting a torque from the top ring drive shaft to the top ring. Thus, the torque from the top ring drive shaft can reliably be transmitted to the top ring through the first and second pins. Further, damping means may be provided on the first pin or the second pin, or on both of the first and second pins, so that the vibration of the top ring drive shaft is hardly transmitted to the top ring.

The above and other objects, features, and advantages of the present invention will become apparent from the following description of illustrative embodiments thereof in conjunction with the accompanying drawings, in which like reference numerals represent the same or similar elements.

DETAILED DESCRIPTION OF THE PREFERRED EMBODIMENTS

Figure 1:
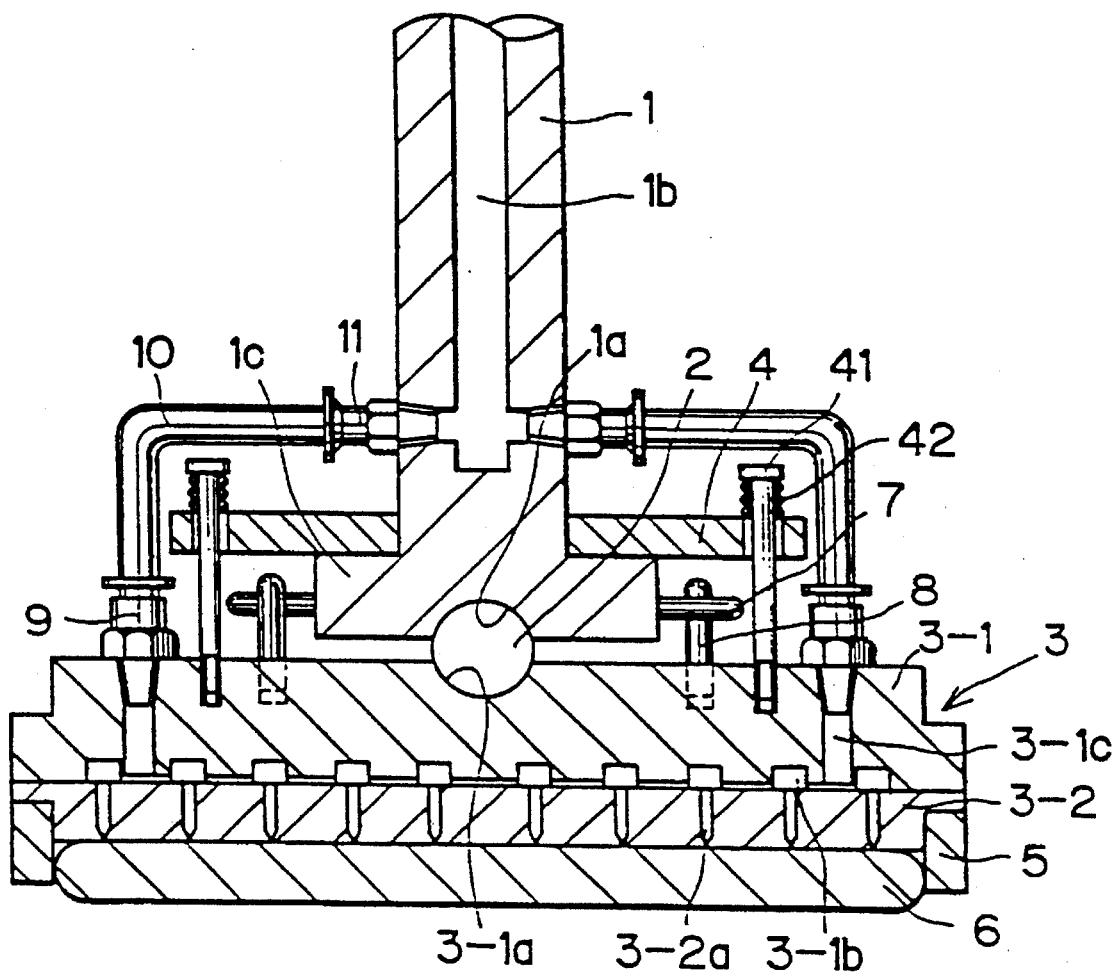
FIG. 1 is a longitudinal sectional side view of the polishing unit of one embodiment of a polishing apparatus according the present invention.
Figure 2:
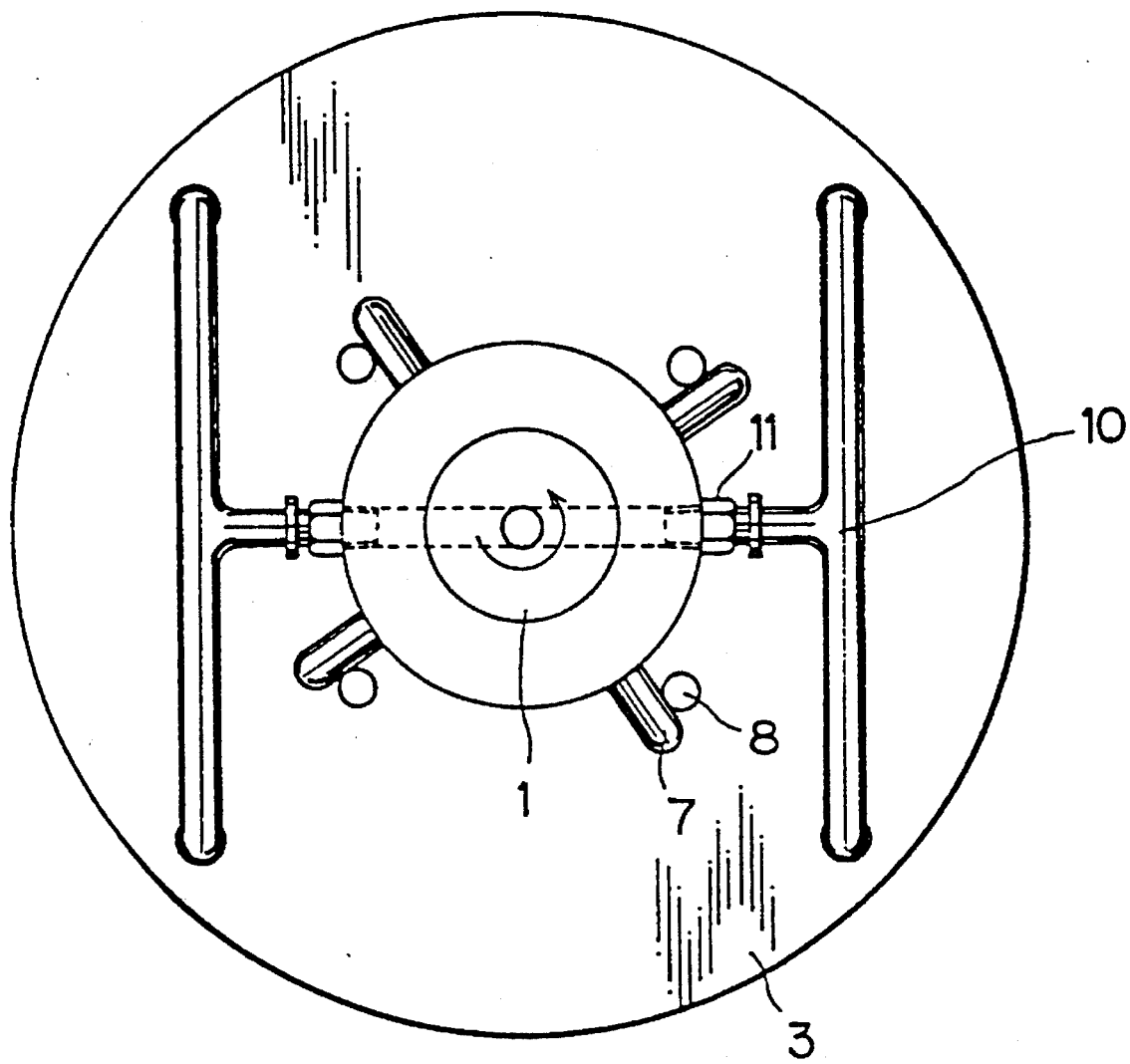
FIG. 2 is a plan view of the polishing unit shown in FIG. 1.

As shown in FIGS. 1 and 2, a polishing unit of a polishing apparatus according to the present invention comprises a vertical top ring drive shaft 1; a workpiece supporting and pressing member comprising a top ring 3; and a spherical bearing 2 interposed between the top ring drive shaft 1 and the top ring 3. The top ring drive shaft 1 has a central spherical concave surface 1a formed in a lower end thereof and held in sliding contact with the spherical bearing 2. The top ring 3 comprises an upper top ring member 3-1 and a lower top ring member 3-2 attached to the lower surface of the upper top ring member 3-1. The upper top ring member 3-1 has a central spherical concave surface 3-1a formed in an upper surface thereof and held in sliding contact with the spherical bearing 2. A wafer retaining ring 5 is mounted on a lower surface of the lower top ring member 3-2 along its outer circumferential edge.

The lower top ring member 3-2 has a plurality of vertical suction holes 3-2a formed therein. The vertical suction holes 3-2a are open at the lower surface of the lower top ring member 3-2. The upper top ring member 3-1 has a plurality of suction grooves 3-1b formed therein and communicating with the suction holes 3-2a, respectively, and a plurality of suction holes 3-1c (four in the illustrated embodiment) formed therein and communicating with the suction grooves 3-1b. The suction holes 3-1c are connected through tube couplings 9, vacuum line tubes 10, and tube couplings 11 to a central suction hole 1b formed axially centrally in the top ring drive shaft 1.

The top ring drive shaft 1 has a radially outwardly extending flange 1c on its lower end from which a plurality of torque transmission pins 7 (four in the illustrated embodiment) extend radially outwardly. The upper surface of the upper top ring member 3-1 has a plurality of torque transmission pins 8 (four in the illustrated embodiment) projecting upwardly into point contact with the torque transmission pins 7, respectively. As shown in FIG. 2, when the top ring drive shaft 1 is rotated about its own axis in the direction indicated by the arrow, the torque transmission pins 7 are held in point contact with the torque transmission pins 8, and cause the top ring 3 to rotate. Even if the top ring 3 is tilted relatively to the top ring drive shaft 1, the torque transmission pins 7, 8 remain reliably in point-to-point contact with each other, although they may contact each other at different positions as long as the top ring drive shaft 1 is rotated.

Figure 3:
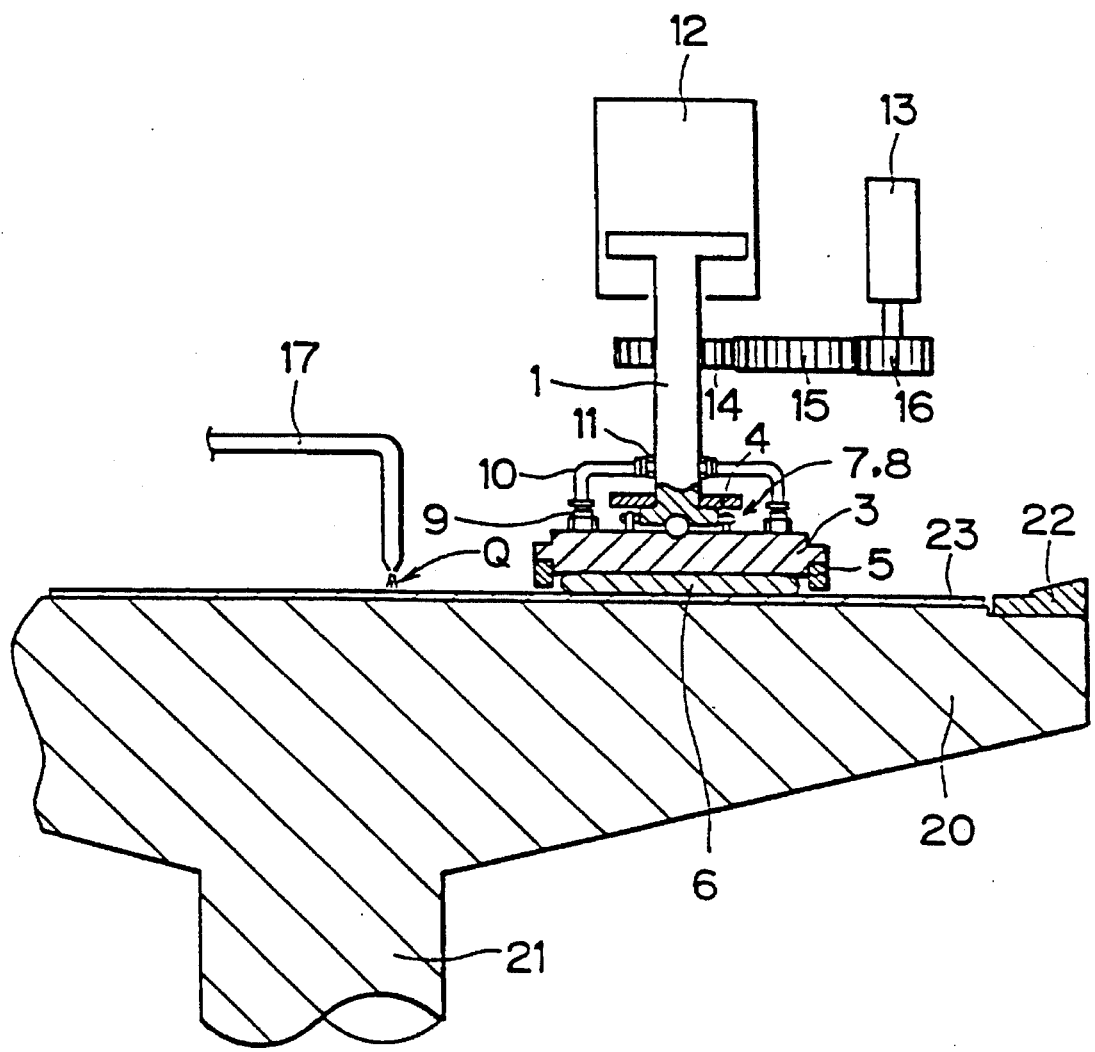
FIG. 3 is a partial sectional view of the polishing apparatus according to the present invention.

A semiconductor wafer 6 to be polished by the polishing apparatus is accommodated in a space defined between the lower surface of the lower top ring member 3-2, the inner circumferential edge of the wafer retaining ring 5, and the upper surface of a turntable 20 (see FIG. 3). The turntable 20 has an abrasive cloth 23 disposed on its upper surface for polishing the lower surface of the semiconductor wafer 6.

In operation, the turntable 20 is rotated and the top ring drive shaft 1 is rotated. The torque of the top ring drive shaft 1 is transmitted to the top ring 3 through point contact between the torque transmission pins 7, 8, thus rotating the top ring 3 with respect to the turntable 20. The semiconductor wafer 6 held by the top ring 3 is thus polished by the abrasive cloth 23 on the turntable 20 to a flat mirror finish.

A top ring holder 4 is mounted on the flange 1c of the top ring drive shaft 1 and fixed to the top ring 3 by a plurality of vertical bolts 41 which extend through said top ring holder 4 and are threaded into the upper top ring member 3-1. Compression coil springs 42 are interposed between the heads of the bolts 41 and the top ring holder 4 for normally urging the top ring holder 4 to be held downwardly against the flange 1c. When the top ring drive shaft 1 with the top ring holder 4 is elevated, the compression coil springs 42 serve to keep the top ring 3 horizontally for thereby facilitating attachment and removal of the semiconductor wafer 6.

FIG. 3 shows the polishing apparatus which incorporates the polishing unit shown in FIGS. 1 and 2. As shown in FIG.

3, the turntable 20 is supported on a central shaft 21 and is rotatable about the axis of the shaft 21. A turntable ring 22 for preventing a slurry-like abrasive spray or the like from being scattered around is mounted on the upper surface of the turntable 20 along its outer circumferential edge. The abrasive cloth 23 is positioned on the upper surface of the turntable 20 radially inwardly of the turntable ring 22.

The polishing unit shown in FIGS. 1 and 2 is located above the turntable 20. The top ring 3 is pressed against the turntable 20 under a constant pressure by a top ring cylinder 12 which houses a slidable piston that is connected to the upper end of the top ring drive shaft 1. The polishing apparatus also has a top ring actuator 13 for rotating the top ring drive shaft 1 through a transmission mechanism comprising a gear 14 fixed to the top ring drive shaft 1, a gear 16 coupled to the output shaft of the top ring actuator 13, and a gear 15 meshing with the gears 14, 16. An abrasive spray nozzle 17 is disposed above the turntable 20 for spraying an abrasive spray Q onto the abrasive cloth 23 on the turntable 20.

The polishing apparatus operates as follows. The semiconductor wafer 6 is attached under a vacuum to the lower surface of the lower top ring member 3-2, and pressed against the abrasive cloth 23 on the turntable 20 by the top ring cylinder 12. At this time, the turntable 20 is rotated by the shaft 21, and the top ring 3 is rotated by the top ring actuator 13. Further, the abrasive spray Q is sprayed from the abrasive spray nozzle 17 onto the abrasive cloth 23. The ejected abrasive spray Q is retained by the abrasive cloth and applied to the lower surface of the semiconductor wafer 6. The semiconductor wafer 6 is polished in contact with the abrasive cloth 23 impregnated with the abrasive spray Q.

When the upper surface of the turntable 20 is slightly tilted during polishing of the semiconductor wafer, the top ring 3 is tilted about the spherical bearing 2 with respect to the top ring drive shaft 1. However, since the torque transmission pins 7 on the top ring drive shaft 1 are held in point-to-point contact with the torque transmission pins 8 on the top ring 3, the torque from the top ring drive shaft 1 can reliably be transmitted to the top ring 3 through the torque transmission pins 7, 8, although they may contact each other at different positions.

Figure 4A:
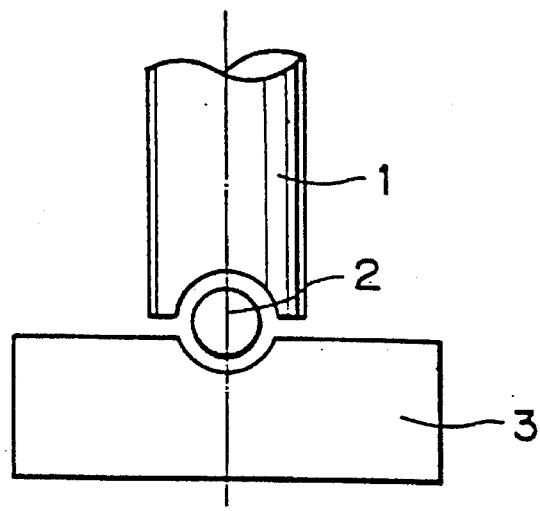
FIGS. 4(a), 4(b) and 4(c) are views showing the manner in which the polishing unit shown in FIGS. 1 and 2 operates.
Figure 4B:
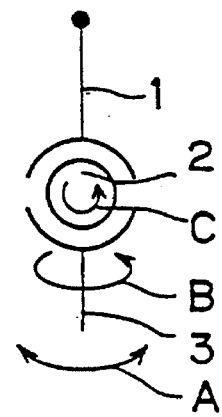
Figure 4C:
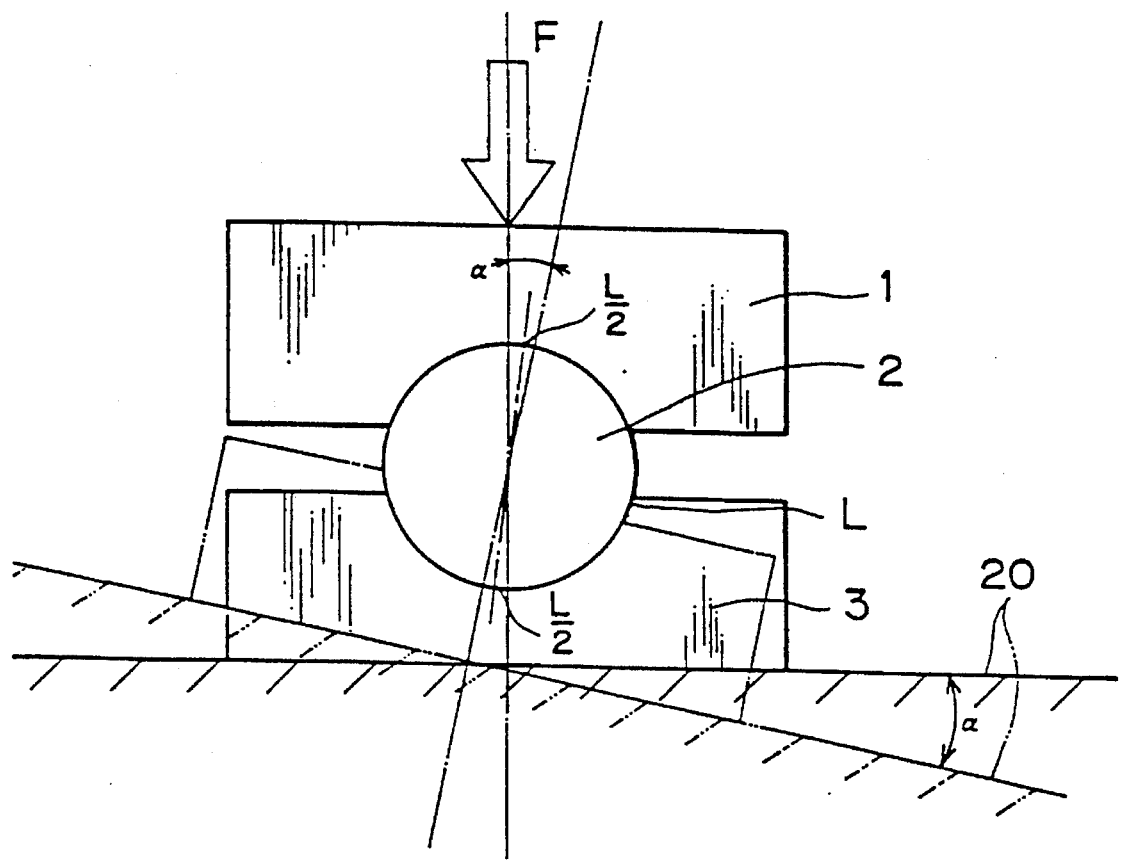

FIG. 4 shows an operation of the polishing unit of the polishing apparatus shown in FIGS. 1 through 3. As shown in FIG. 4(*a*), the polishing unit comprises of three separate members, namely a top ring drive shaft 1, a spherical bearing 2 and a top ring 3. The spherical bearing 2 is made of ceramics, and the top ring drive shaft 1 and the top ring 3 have respective contacting portions made of stainless steel which contact the spherical bearing 2, respectively.

Figure 17A:
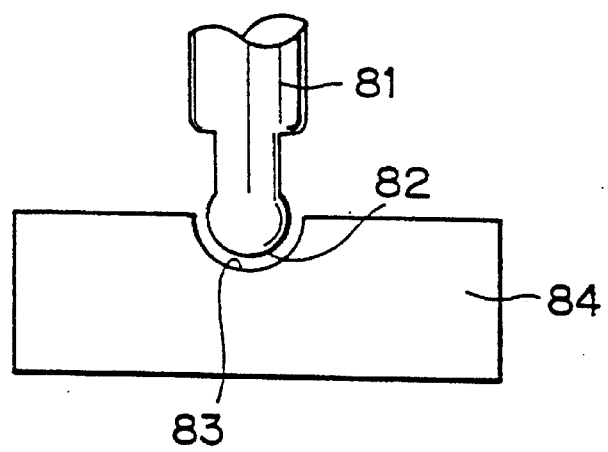
FIG. 17(a) is a schematic view of a conventional polishing unit of a polishing apparatus.
Figure 17B:
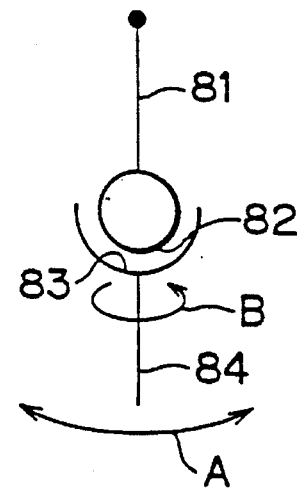
FIG. 17(b) is a view showing the manner in which the polishing unit shown in FIG. 17(a) operates.
Figure 18A:
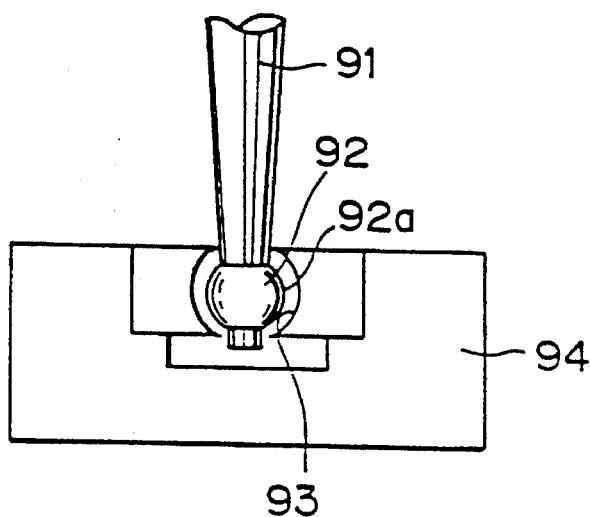
FIG. 18(a) is a schematic view of another conventional polishing unit of a polishing device.
Figure 18B:
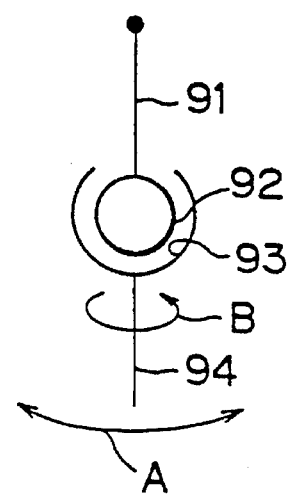
FIG. 18(b) is a view showing the manner in which the polishing unit shown in FIG. 18(a) operates.
Figure 19:
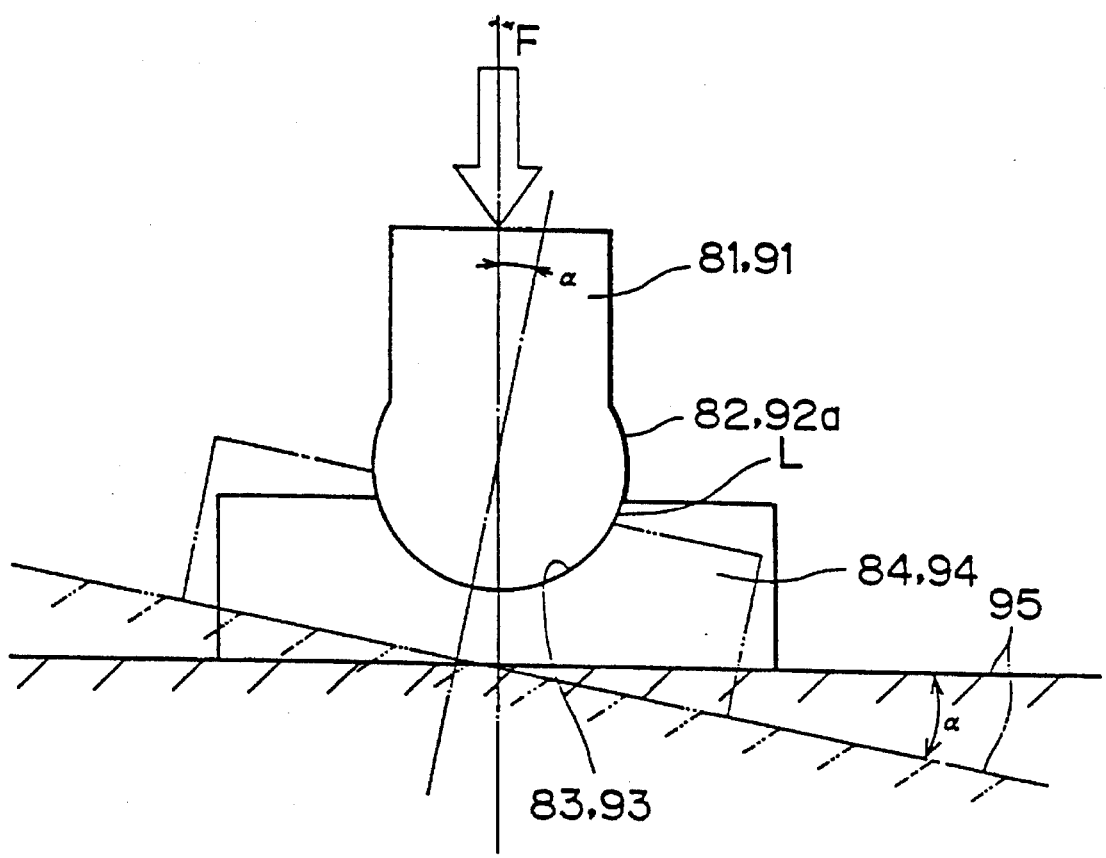
FIG. 19 is a view showing the manner in which the polishing units of the conventional polishing apparatuses shown in FIGS. 17 and 18 operate.

Therefore, as shown in FIG. 4(*b*), the top ring 3 is tiltable with respect to the spherical bearing 2 as indicated by the arrow A and rotatable about its own axis as indicated by the arrow B. Further, the spherical bearing 2 is rotatable about its own center as indicated by the arrow C. Since the spherical bearing 2 capable of performing a free movement is interposed between the top ring drive shaft 1 and the top ring 3, the degree of freedom is greater than that in the conventional apparatuses shown in FIGS. 17 and 18. Thus, the top ring 3 can perform respective single movements indicated by the arrows A, B and C as well as compound movements which are a combination of the single movements, thus enabling the polishing unit to follow the turntable surface smoothly and quickly.

When the top ring 3 is pressed against the turntable 20 which is being tilted from a horizontal plane at an angle a under the force F as shown in FIG. 4(*c*), the top ring 3 moves by an apparent circular arc length L. Since the spherical bearing 2 has degrees of freedom with respect to not only the top ring 3 but also the top ring drive shaft 1, the spherical bearing 2 can move with respect to the top ring drive shaft 1. The top ring 3 and the top ring drive shaft 1 have respective contacting portions which contact the spherical bearing 2 and have the same coefficient of friction. Therefore, when the top ring 3 is being tilted by an angle a with respect to the turntable surface, the spherical bearing 2 moves by an arc length L/2 with respect to the top ring drive shaft 1 and the top ring 3 can also move by an arc length L/2 with respect to the spherical bearing 2. Thus, the top ring 3 can follow the turntable surface in one-half the time of the conventional polishing apparatuses shown in FIGS. 17 and 18.

Further, when the top ring 3 is pressed against the abrasive cloth 23, vibration may be generated due to friction between the semiconductor wafer 6 and the abrasive cloth Especially, as the friction between the top ring 3 and the abrasive cloth 23 is varied from static friction into kinetic friction at the beginning of rotation, stick-slip occurs to thereby cause rotational irregularity, resulting in vibration of the top ring. In the conventional polishing apparatuses shown in FIGS. 17 and 18, vibration caused by the rotation of the turntable is easily transmitted to the top ring drive shaft.

According to the present invention, vibration caused by the rotation of the turntable is hardly transmitted to the top ring drive shaft 1 because the spherical bearing 2 has a degree of freedom in a rotational direction with respect to the top ring drive shaft.

Figure 5:
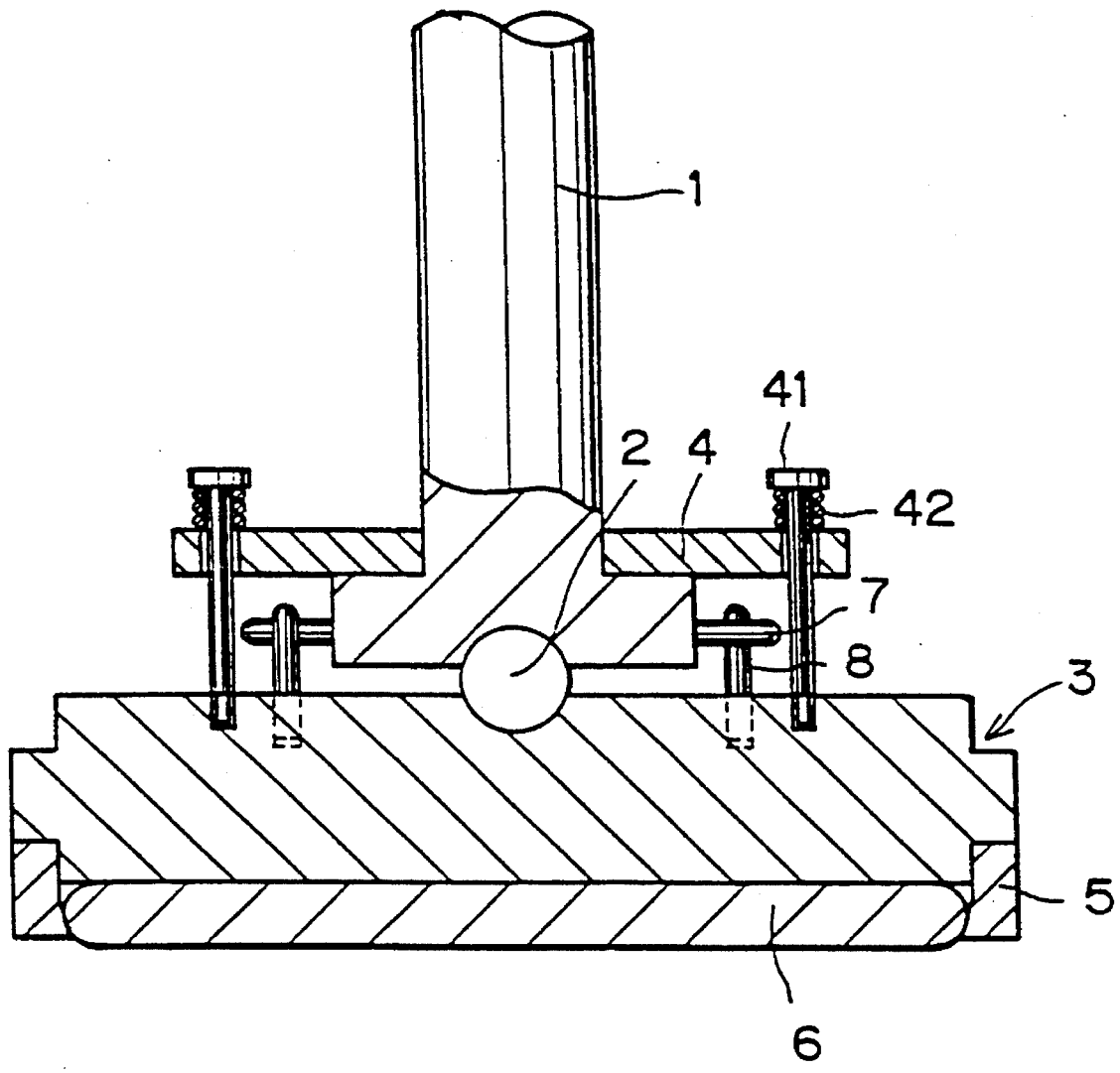
FIG. 5 is a longitudinal sectional view of a polishing unit of another embodiment of a polishing apparatus according to the present invention.

FIG. 5 shows a polishing unit of a modified embodiment of the present invention. As shown in FIG. 5, the polishing unit has a top ring 3 which is devoid of any suction holes and suction grooves, and a top ring drive shaft 1 that has no axial suction hole. Therefore, the top ring 3 shown in FIG. 5 is unable to attract a semiconductor wafer 6 to its lower surface under a vacuum. The other details of the polishing unit shown in FIG. 5 are identical to those of the polishing unit shown in FIGS. 1 and 2. Even though the top ring 3 cannot attract the semiconductor wafer 6 under a vacuum, the polishing unit is still capable of polishing the semiconductor wafer 6 to a flat mirror finish.

Figure 6:
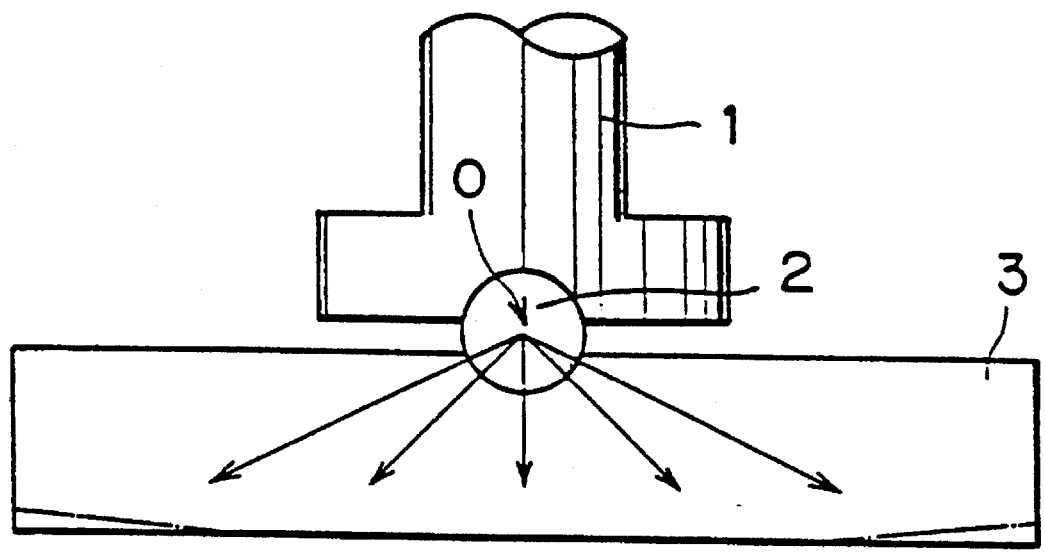
FIG. 6 is a schematic view showing the manner in which a spherical bearing of the polishing unit operates.

When a semiconductor wafer is polished to a flat mirror finish by the above-described embodiments, the outer circumferential edge of the semiconductor wafer is prevented from being excessively rounded. More specifically, inasmuch as the top ring 3 is supported on the lower end of the top ring drive shaft 1 through the spherical bearing 2, stresses are developed in the top ring 3 in directions toward the center O of the spherical bearing 2, and the magnitudes of those stresses away from the center O of the spherical bearing 2 are smaller than those near the center O, as shown in FIG. 6. By choosing a top ring 3 of a suitable rigidity, those portions of the top ring 3 distant from the center thereof are deformed upwardly as indicated by the dot-and-dash lines in FIG. 6. As the pressure is concentrated near the center of the top ring 3, the outer circumferential edge of the semiconductor wafer may be prevented from being excessively ground off.

Figure 7:
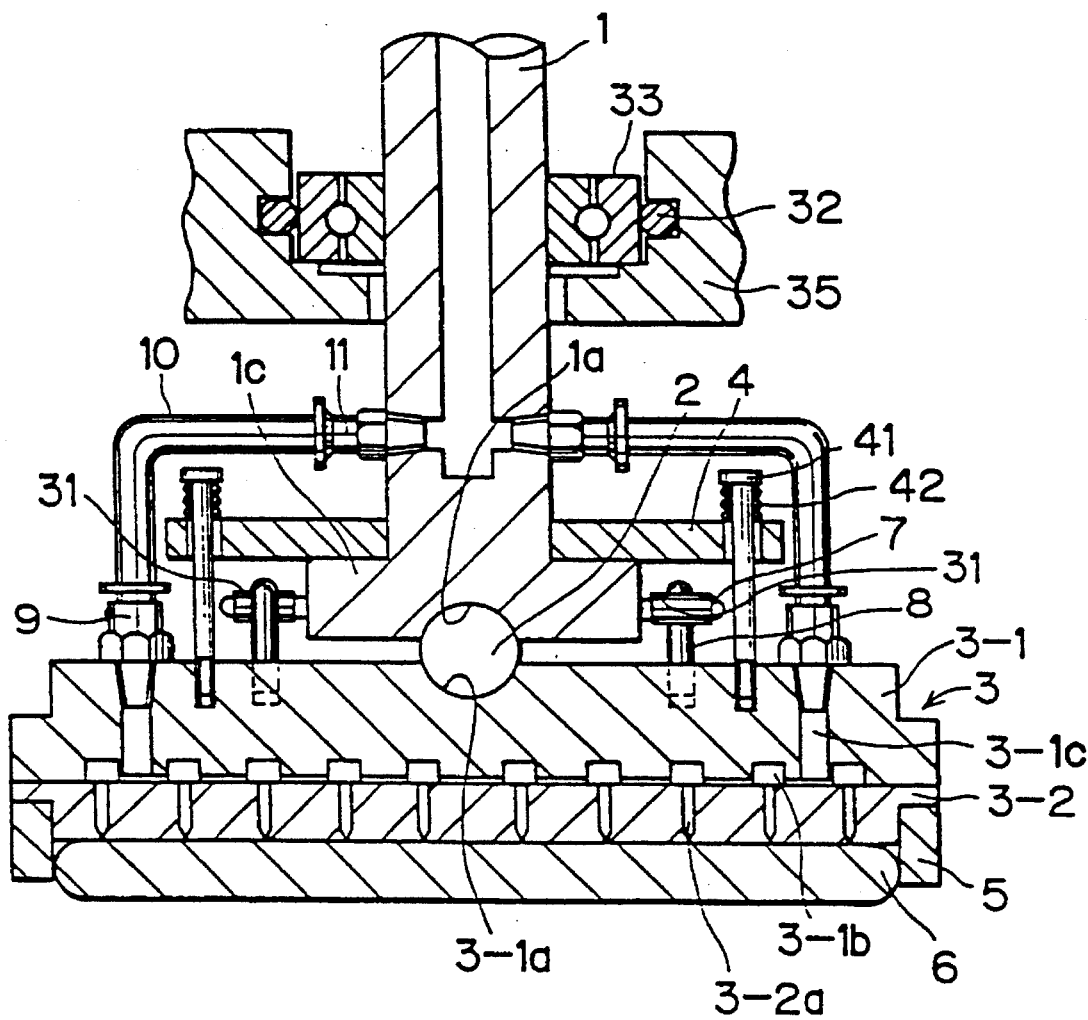
FIG. 7 is a longitudinal sectional view of a polishing unit of still another embodiment of a polishing apparatus according to the present invention.
Figure 8:
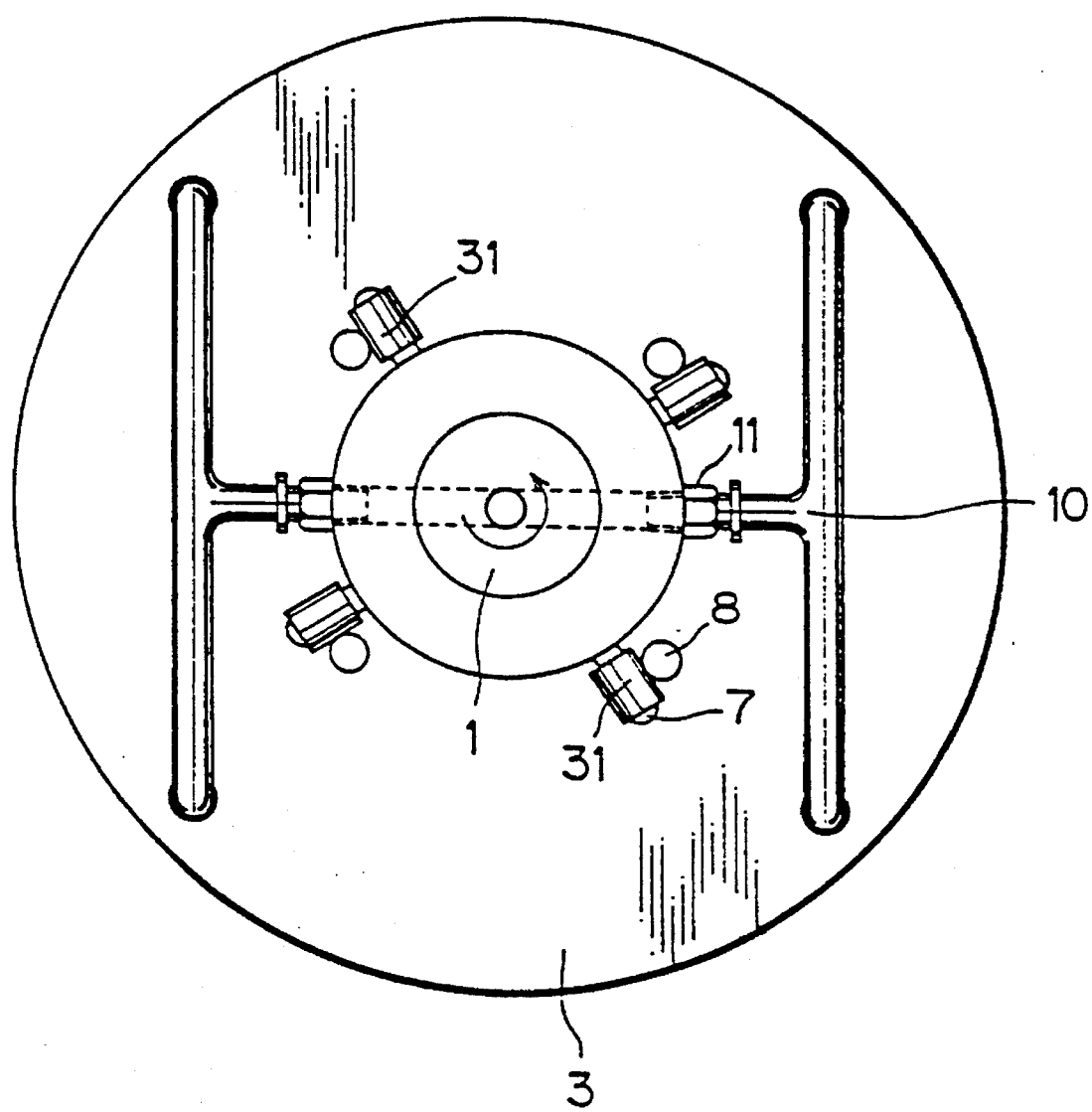
FIG. 8 is a plan view of the polishing unit shown in FIG. 7.

In the embodiment shown in FIGS. 1 and 2, the torque transmission pin 7 on the top ring drive shaft 1 contacts the torque transmission pin 8 on the top ring 3 directly, whereby vibration of the top ring drive shaft 1 is directly transmitted to the top ring 3, thus adversely effecting the polishing of the semiconductor wafer. In order to prevent vibration from being transmitted from the top ring drive shaft 1 to the top ring 3, an elastic member 31 such as a rubber member is mounted, as shown in FIGS. 7 and 8, on the torque transmission pin 7, so that the torque transmission pin 7 engages the torque transmission pin 8 through the elastic member 31. The vibration of the top ring drive shaft 1 is absorbed by the elastic member 31 and is hardly transmitted to the top ring 3. The elastic member 31 may be mounted on the torque transmission pin 8, or on both of the torque transmission pins 7 and 8.

In order to dampen vibration of the top ring drive shaft more effectively, an O-ring 32 is interposed, as shown in FIG. 7, between a radial bearing 33 for supporting the top ring drive shaft 1 and a stationary member 35, fixed to a frame (not shown), for supporting the radial bearing 33. The O-ring 32 constitutes a damping mechanism which dampens the vibration of the top ring drive shaft 1.

Figure 9:
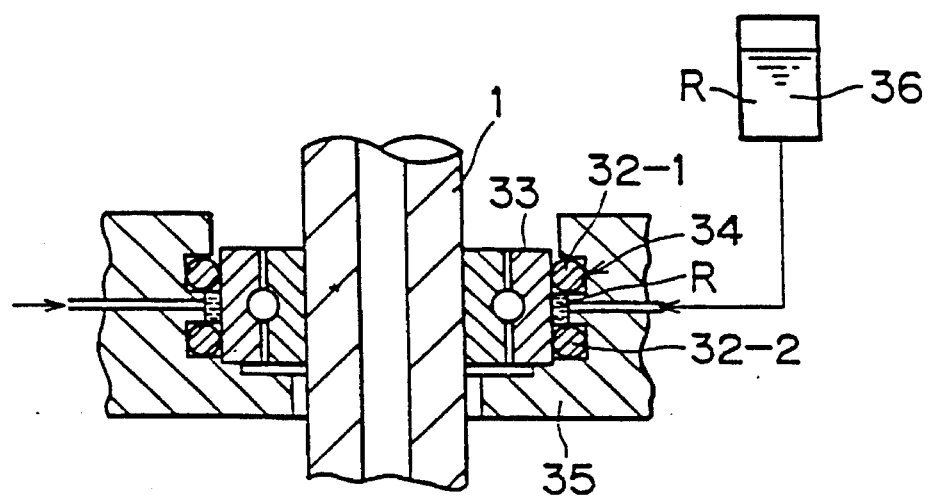
FIG. 9 is a cross-sectional view of a bearing unit of a top ring drive shaft according to the present invention.

FIG. 9 shows another damping mechanism 34. As shown in FIG. 9, two O-rings 32-1, 32-2 which are spaced from each other are interposed between the radial bearing 33 and the stationary member 35. An oil reservoir 36 is provided to supply oil R to a space defined by the O-rings 32-1 and 32-2, the radial bearing 33 .and the stationary member 35.

The vibration of the top ring drive shaft 1 is absorbed by the damping mechanism 34 comprising the O-rings 32-1, 32-2 and the reservoir tank 36 for supplying oil R to the space defined by the O-rings 32-1, 32-2, the radial bearing 33 and the stationary member 35.

In FIGS. 8 and 9, the damping mechanism comprising the Oring 32 (FIG. 8) or the damping mechanism 34 (FIG. 9) is provided between the radial bearing 33 and the stationary member 35. However, the damping mechanism may be provided between the top ring drive shaft 1 and the radial bearing 33.

Figure 10:
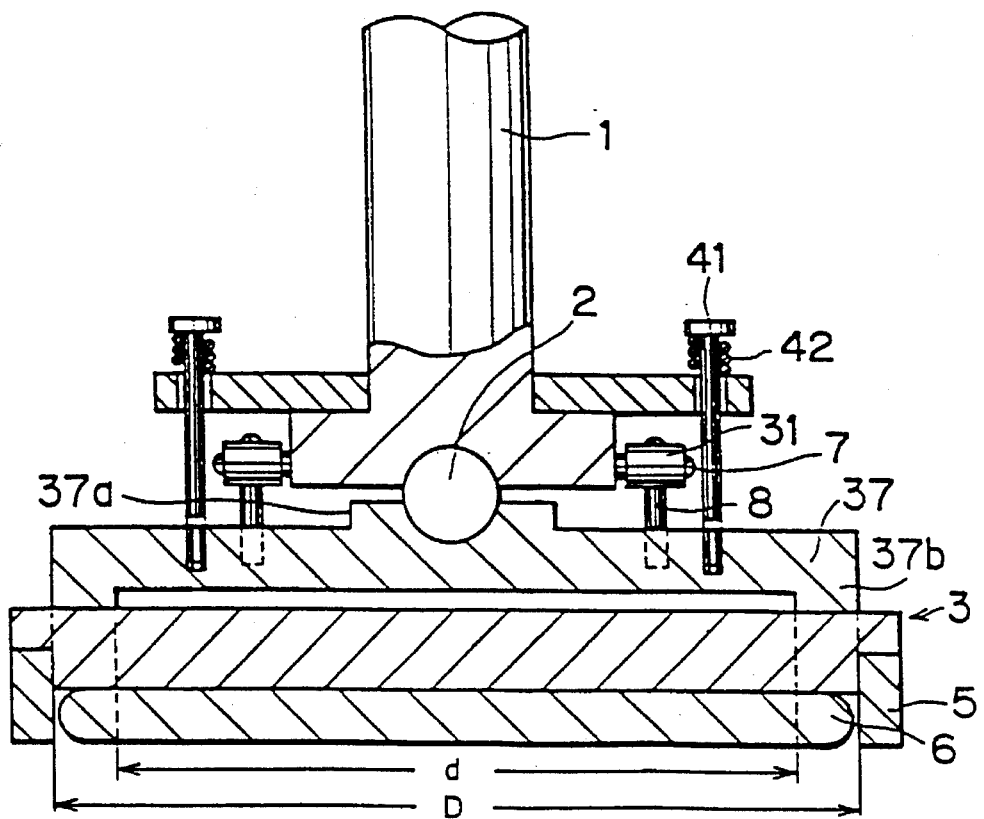
FIG. 10 is a cross-sectional view of a pressure adjusting mechanism for establishing the pressure distribution at a lower surface of a top ring in a polishing apparatus according to the present invention.

In order to polish the workpiece uniformly, it is necessary to equalize the pressure distribution of the lower surface of the top ring 3. FIG. 10 shows a workpiece supporting and pressing member that includes, in addition to the top ring 3, a pressure adjusting mechanism for distributing thrust equally over the lower surface of the top ring 3. The pressure adjusting member 37 is interposed between the spherical bearing 2 and the top ring 3. The pressure adjusting member 37 has a circular upper projection 37a at an upper surface thereof and an annular lower projection 37b at a lower surface thereof. The upper projection 37a has a central spherical concave surface for accommodating the spherical bearing 2, and the lower projection 37b contacts the upper surface of the top ring 3. The pressure distribution of the lower surface of the top ring 3 is established on the basis of the area of the lower projection 37b and the top ring 3. That is, in FIG. 10, the pressure distribution of the lower surface of the top ring 3 is established by the ratio (d/D) of an inner diameter (d) to an outer diameter (D). Incidentally, in FIG. 10, a desired pressure distribution at the lower surface of the top ring 3 may be established by making d=0 and selecting an appropriate outer diameter (D).

The pressure adjusting mechanism is not limited to the pressure adjusting member 37 shown in FIG. 10 but may comprise an air bag or the like which is provided between the pressure adjusting member 37 and the top ring 3 and exerts a uniformly distributed pressure on the upper surface of the top ring 3.

Figure 11:
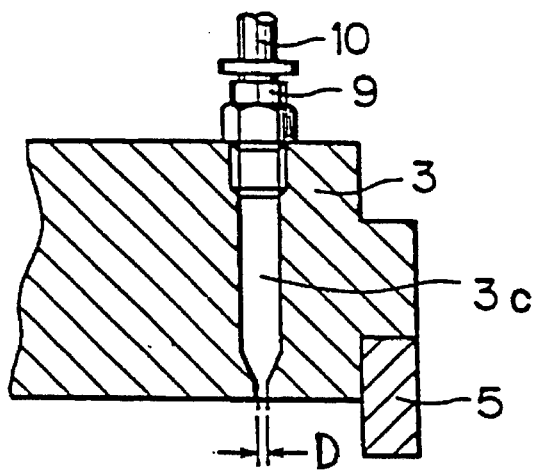
FIG. 11 is a longitudinal sectional view of a top ring of a polishing apparatus according to the present invention.
Figure 12:
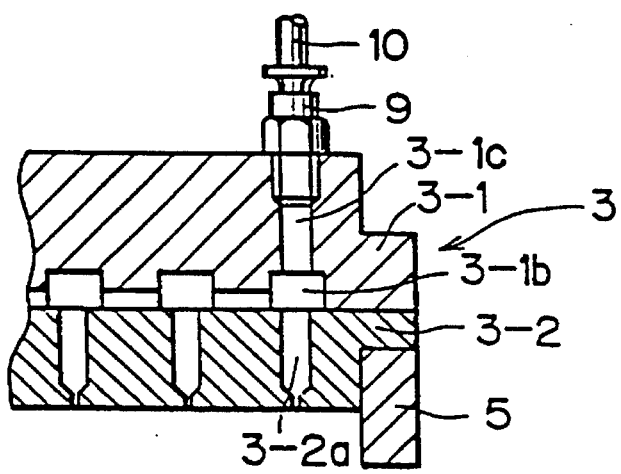
FIG. 12 is a longitudinal sectional view of a top ring of another embodiment of a polishing apparatus according to the present invention.
Figure 13:
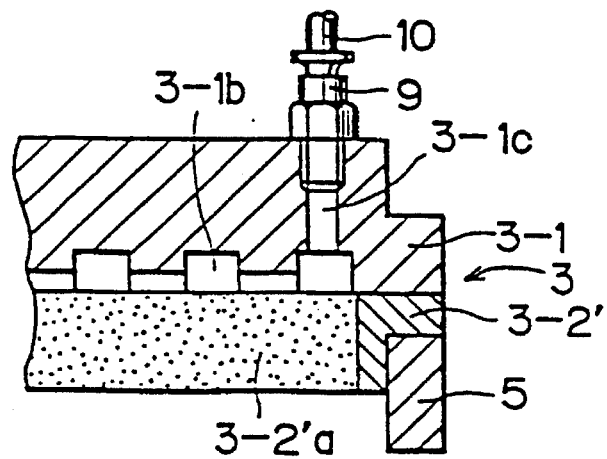
FIG. 13 is a longitudinal sectional view of a top ring of still another embodiment of a polishing apparatus according to the present invention.

In the embodiments shown in FIGS. 1 and 2, and FIGS. 7 and 8, the top ring 3 has a plurality of suction holes to attract the semiconductor wafer 6 thereto. FIGS. 11 through 13 show different top rings according to various embodiments of the present invention.

In FIG. 11, a top ring 3 is of a unitary structure and has a plurality of suction holes 3c (four are provided in the embodiment) each having a tapered lower end whose diameter D ranges from 0.5 mm to 1.0 mm and which is open at the bottom surface of the top ring 3. The suction holes 3c communicate with the respective vacuum line tubes 10 through the tube couplings 9.

According to the embodiment shown in FIG. 12, a top ring 3 comprises an upper top ring member 3-1 and a lower top ring member 3-2. The lower top ring member 3-2 has a plurality of suction holes 3-2a having tapered lower ends opening at the lower surface thereof. The upper top ring member 3-1 has a plurality of suction grooves 3-1b communicating with the respective suction holes 3-2a. The suction grooves 3-1b also communicate with the four suction holes 3-1c that are formed in the upper top ring member 3-1 and held in communication with the respective vacuum line tubes 10 through the tube couplings 9.

In FIG. 13, a top ring 3 comprises an upper top ring member 3-1 and a lower top ring member 3-2 which is of an annular shape. A top ring plate 3-2'a made of a porous ceramic spray with a number of pores is fitted in the lower top ring member 3-2'. The upper top ring member 3-1 has a plurality of suction grooves 3-1b communicating with the pores of the top ring plate 3-2'a. The suction grooves 3-1b also communicate with the four suction holes 3-1c that are formed in the upper top ring member 3-1 and held in communication with the respective vacuum line tubes 10 through the tube couplings 9.

Figure 14:
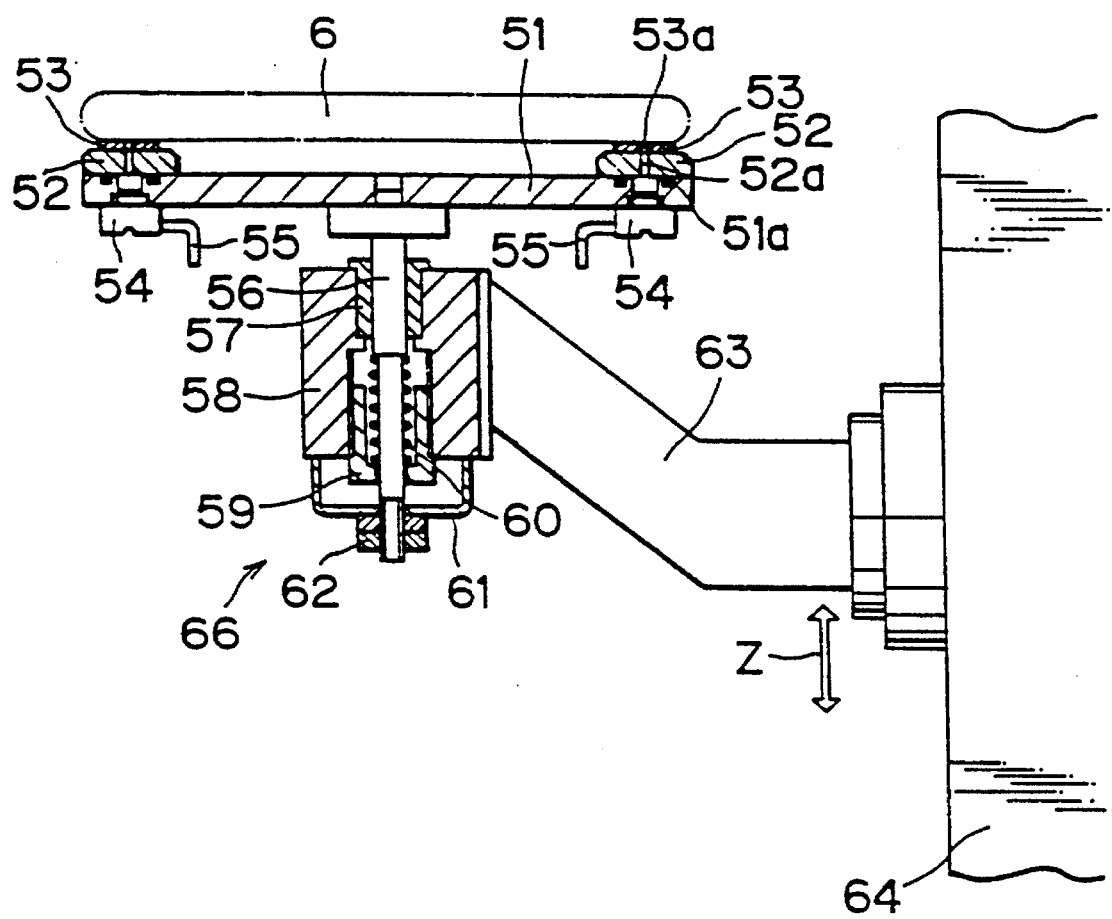
FIG. 14 is a longitudinal sectional view of a transferring device incorporated in a polishing apparatus according to the present invention.

Next, a transferring device 66 incorporated in the polishing apparatus for transferring a semiconductor wafer to and from the top ring will be described below with reference to FIGS. 14 through 16. In FIG. 14, a disk-like base 51 has a plurality of supports 52 at the upper circumferential surface thereof. A pad 53 is attached to the support 52. A suction hole 52a and a suction hole 53a are formed in the support 52 and the pad 53, respectively. The suction hole 52a and the suction hole 53a which communicate with each other also communicate with a vacuum line tube 55 through a coupling 54.

The base 51 is fixed to an upper end of a shaft 56 which is slidably supported by a sleeve-like bearing 57 fixed to a bearing housing 58. A spring 60 is interposed between the shaft 56 and a spring retainer 59 fixed to the bearing housing 58 so that the shaft 56 is urged upwardly. The spring retainer 59 has a thread, on the outer periphery thread, which is threaded into a tapped hole formed in the bearing housing 58. Nuts 62 are threaded over the lower end of the shaft 56 and contact a stopper 61, and hence the shaft 56 is prevented from being lifted by the spring 60. The bearing housing 58 is fixed to a forward end of an arm 63 which is moved up and down by an elevator 64 as shown by the arrow Z in FIG. 14.

The transferring device 66 operates as follows. A semiconductor wafer 6 is placed on the pad 53 and is attracted to the pad 53 when the vacuum line tube 55 is communicates with a vacuum source (not shown). When a pressure such as an impact force is applied to the base 51 through the pad 53 and the support 52, the shaft 56 is lowered against the urging force of the spring 60. That is, the sleeve-like bearing 57, the bearing housing 58, the spring retainer 59 and the spring 60 jointly constitute a shock absorber. An O-ring 51a is interposed between the support 52 and the base 51 for effecting a seal therebetween.

Figure 15:
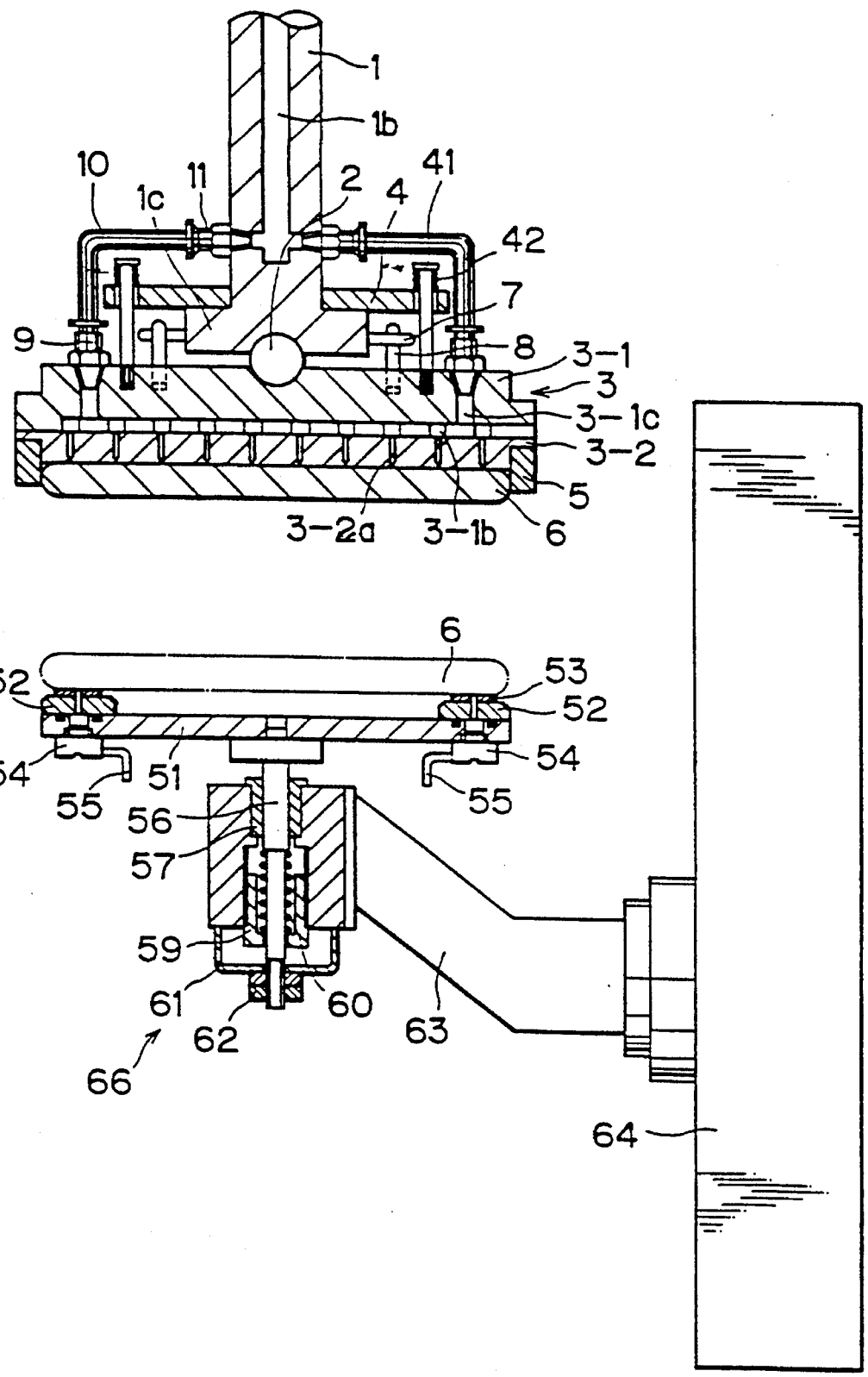
FIG. 15 is a schematic view showing the manner in which the transferring device shown in FIG. 14 operates.

FIG. 15 shows the manner in which the transferring device 66 shown in FIG. 14 operates. When the top ring drive shaft 1 is elevated together with the top ring 3 and the top ring holder 4, the spring 42 maintains the top ring 3 horizontally. This function is effective to transfer the semiconductor wafer 6 from the top ring 3 to a next process, or from a preceding process to the top ring 3.

To attract the semiconductor wafer 6 to the lower surface of the top ring 3, the suction hole 1b provided at the central portion of the top ring drive shaft 1 communicates with the vacuum source, thereby aspirating air through the suction holes 3-2a of the lower top ring member 3-2. At this time, the semiconductor wafer 6 placed on the pad 53 is elevated by the elevator 64. When the semiconductor wafer 6 reaches the lower surface of the top ring 3, the semiconductor wafer 6 is attracted to the lower surface of the top ring 3 by the vacuum.

At this time, the base 51 is subject to a downward force and is pushed down, but this force is absorbed by the downward movement of the shaft 66 against the urging force of the spring 60. Therefore, the semiconductor wafer 6 is not subject to an impact force. When the semiconductor wafer 6 is transferred from the top ring 3 to the transferring device 66, the pad 53 is brought into contact with the lower surface of the semiconductor wafer 6, simultaneously the suction hole 1b is disconnected from the vacuum source, and the vacuum line tube 55 communicates with the vacuum source. Hence, the semiconductor wafer 6 is attracted to the pad 53. At this time, even though the base 51 is subject to a force and pushed downwardly by the top ring 3, this force is absorbed by downward movement of the shaft 56 against the urging force of the spring 61. Therefore, the semiconductor wafer 6 is not subject to an impact force.

Since the polishing apparatus is provided with the transferring device 66 including the shock absorber, even if a stepping motor is used as a driving motor of the elevator 64, the stepping motor does not loose synchronism. The shock absorber is not limited to a mechanism using a spring but may utilize various mechanisms which can absorb an impact force when the semiconductor wafer is transferred.

Figure 16:
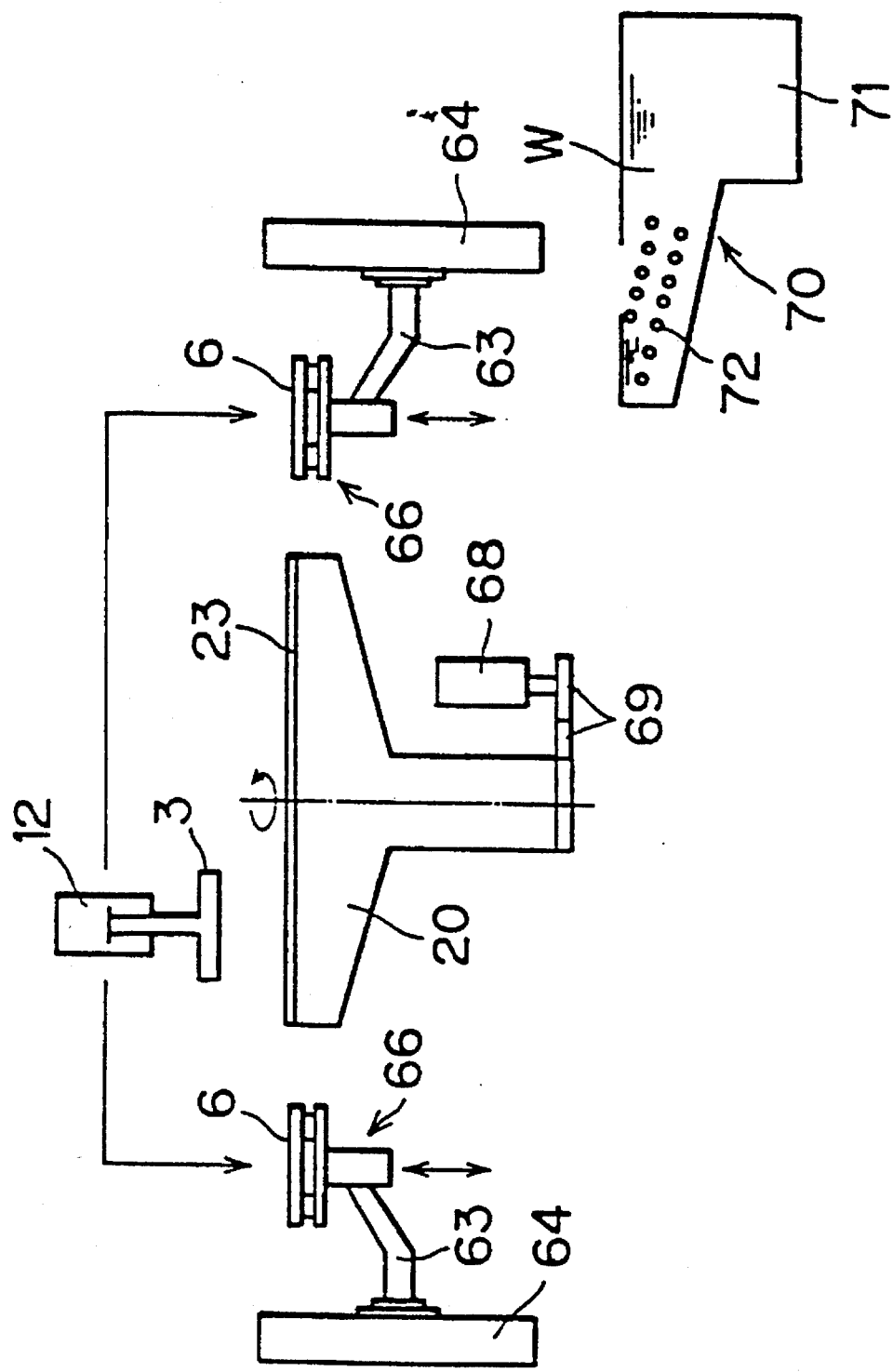
FIG. 16 is a schematic view of the polishing apparatus shown in FIG. 14 combined with a washing unit.

FIG. 16 shows the polishing apparatuses shown in FIGS. 14 and 15 combined with a washing unit.

As shown in FIG. 16, the transferring device 66 is disposed at a loading side of the semiconductor wafer, the transferring device 66 and a washing unit 70 are disposed at an unloading side of the semiconductor wafer, and the turntable 20 is disposed between the loading side and the unloading side. When the arm 63 is elevated by the elevator 64, the semiconductor wafer 6 placed on the transferring device 66 is attracted to the lower surface of the top ring 3. While the turntable 20 is being rotated by a motor 68 through a transmission mechanism 69, the semiconductor wafer 6 is attached by a vacuum to the lower surface of the top ring 3 and is pressed against the abrasive cloth 23 on the turntable 20 by the top ring cylinder 12. The semiconductor wafer 6 is polished in contact with the abrasive cloth 23 impregnated with the abrasive material. During the operation, the top ring 3 is rotated and the semiconductor wafer 6 is brought into sliding contact with the abrasive cloth 23.

After the semiconductor wafer 6 is polished, the semiconductor wafer 6 is received by the transferring device 66 at the unloading side. The semiconductor wafer 6 on the transferring device 66 at the unload side is conveyed to the washing unit 70 by lowering the arm 63. The washing unit 70 is provided with a tank 71 for containing washing solution W such as pure water, and feed rollers and washing rollers 72 disposed in the tank 71. The semiconductor wafer 6 is washed while being conveyed by the feed rollers and the washing rollers 72.

Workpieces that can be polished by the polishing apparatus according to the present invention are not limited to semiconductor wafers.

The polishing apparatus shown in FIGS. 1 through 16 offer the following advantages:

(1) The top ring 3 and the top ring drive shaft 1 rotate in synchronization with each other while the top ring 3 follows any tilted movement of the turntable 20. Consequently, the semiconductor wafer 6 can be polished highly accurately to a flat mirror finish, and the quality of the polished surface is made stable. (2) Since the top ring 3 and the top ring drive shaft 1 rotate in synchronism with each other, a vacuum line extending from the top ring drive shaft 1 to the top ring 3 and a pressure line for applying a pressure to press the top ring 3 against the turntable 20 can be designed easily and freely without undue limitations.

(3) Since the torque transmission pins 7 on the top ring drive shaft 1 are held in point contact with the torque transmission pins 8 on the top ring 3, the torque from the top ring drive shaft 1 can reliably be transmitted to the top ring through the transmission pins 7, 8, although they may contact each other at different positions. Further, damping means may be provided on the torque transmission pins 8 on the top ring 3 or on the torque transmission pins 7 on the top ring drive shaft 1, or on both of the transmission pins 7, 8, whereby vibration of the top ring drive shaft 1 is hardly transmitted to the top ring 3. Since the damping means may be provided between the top ring drive shaft 1 and the radial bearing 33, or between the radial bearing 33 and the stationary member 35, vibration of the top ring drive shaft 1 is hardly transmitted to the top ring 3. Consequently, the semiconductor wafer 6 can be polished highly accurately to a flat mirror finish.

(4) Since the pressure adjusting means may be provided between the spherical bearing 2 and the top ring 3, the pressure at the lower surface of the top ring 3 is distributed equally, and thus the semiconductor wafer 6 can be polished highly accurately to a flat mirror finish.

(5) Since shock absorbing means may be provided on the transferring device 66 for transferring the semiconductor wafer 6 to and from the top ring 3, a complicated pressure adjustment of the top ring cylinder 12 for pressing the top ring 3 is not required. Further, the semiconductor wafer 6 is protected from pressure-induced damage when the top ring 3 is pressed against the semiconductor wafer 6 when the semiconductor wafer 6 is transferred.

Although certain preferred embodiments of the present invention have been shown and described in detail, it should be understood that various changes and modifications may be made therein without departing from the scope of the appended claims.

What is claimed is:

1. A polishing apparatus for polishing a surface of a workpiece, comprising:

a turntable having an abrasive cloth at an upper surface thereof;

a workpiece supporting and pressing member for supporting the workpiece to be polished and pressing the workpiece against said abrasive cloth, said workpiece supporting and pressing member comprising a top ring positioned above said turntable;

a top ring drive shaft coupled to said top ring; and a spherical bearing interposed between said workpiece supporting and pressing member and said top ring drive shaft, said spherical bearing comprising spherical seats formed in said workpiece supporting and pressing member and in said top ring drive shaft, respectively, and a single sphere seated in said seats so as to allow said top ring to tilt upon changes in the inclination of said upper surface of said turntable, the radius of said sphere being substantially the same as the radius of curvature of each of said spherical seats.

2. The polishing apparatus according to claim 1, wherein said top ring has a plurality of suction holes connected to a vacuum source, whereby the workpiece is attractable to a lower surface of said top ring under a vacuum developed by said vacuum source.

3. The polishing apparatus according to claim 1, wherein said top ring comprises a porous plate connected to a vacuum source, whereby the workpiece is attractable to a lower surface of said porous plate under a vacuum developed by said vacuum source.

4. The polishing apparatus according to claim 1, and further comprising at least one first pin mounted on said top ring drive shaft and at least one second pin mounted on said top ring, said first pin and said second pin being held in point contact with each other such that torque from said top ring drive shaft is transmitted to said top ring via said pins.

5. A polishing apparatus for polishing a surface of a workpiece, comprising:

a turntable having an abrasive cloth at an upper surface thereof;

a top ring positioned above said turntable for supporting the workpiece to be polished and pressing the workpiece against said abrasive cloth;

a top ring drive shaft coupled to said top ring;

a spherical bearing interposed between said top ring and said top ring drive shaft for allowing said top ring to tilt upon changes in the inclination of said upper surface of said turntable;

at least one first pin mounted on said top ring drive shaft and at least one second pin mounted on said top ring, said first pin and said second pin being held in point contact with each other such that torque from said top ring drive shaft is transmitted to said top ring via said pins; and damping means provided on at least one of said first pin and said second pin for inhibiting the transmission of vibrations from said top ring drive shaft to said top ring.

6. The polishing apparatus according to claim 5, wherein said damping means comprises an elastic member mounted on at least one of said first pin and said second pin.

7. A polishing apparatus for polishing a surface of a workpiece, comprising:

a turntable having an abrasive cloth at an upper surface thereof;

a top ring positioned above said turntable for supporting the workpiece to be polished and pressing the workpiece against said abrasive cloth;

a top ring drive shaft coupled to said top ring;

a stationary member supporting said top ring drive shaft;

a spherical bearing interposed between said top ring and said top ring drive shaft for allowing said top ring to tilt upon changes in the inclination of said upper surface of said turntable; and damping means for damping said top ring drive shaft, said damping means being provided between said top ring drive shaft and said stationary member supporting said top ring drive shaft.

8. The polishing apparatus according to claim 7, and further comprising a radial bearing interposed between said stationary member and said top ring drive shaft, and wherein said damping means comprises an O-ring interposed between said radial bearing and said stationary member.

9. The polishing apparatus according to claim 7, wherein said damping means comprises oil supplying means for supplying oil into a space defined between said top ring drive shaft and said stationary member.

10. The polishing apparatus according to claim 9, and further comprising a radial bearing interposed between said stationary member and said top ring drive shaft, and wherein said space is defined between said radial bearing and said stationary member.

11. The polishing apparatus according to claim 1, and further comprising biasing means for resiliently holding said top ring in a predetermined plane with respect to said top ring drive shaft.

12. A polishing apparatus for polishing a surface of a workpiece, comprising:

a turntable having an abrasive cloth at an upper surface thereof;

a top ring positioned above said turntable for supporting the workpiece to be polished and pressing the workpiece against said abrasive cloth;

a top ring drive shaft coupled to said top ring;

a spherical bearing interposed between said top ring and said top ring drive shaft for allowing said top ring to tilt upon changes in the inclination of said upper surface of said turntable; and a top ring holder movably mounted on said top ring drive shaft, a plurality of retaining members extending through said top ring holder and fixed to said top ring, and a plurality of springs between said top ring holder and said retaining members, said springs resiliently urging said top ring holder against said top ring drive shaft to hold said top ring in a predetermined plane with respect to said top ring drive shaft.

13. The polishing apparatus according to claim 1, and further comprising a transferring device provided in the vicinity of said turntable for transferring the workpiece to said top ring, said transferring device including holding means for holding said workpiece, and shock absorbing means for resiliently supporting said holding means to suppress the effect of an impact on the workpiece during the transfer process.

14. The polishing apparatus according to claim 13, wherein the holding means comprise a support member having a suction hole connected to a vacuum source for attracting said workpiece to said support member.

15. The polishing apparatus according to claim 13, wherein said shock absorbing means comprise a spring for urging said holding means upwardly.

16. The polishing apparatus according to claim 1, wherein said spherical seats have the same coefficient of friction.

17. A polishing apparatus for polishing a surface of a workpiece, comprising:

a turntable having an abrasive cloth at an upper surface thereof;

a top ring positioned above said turntable for supporting the workpiece to be polished and pressing the workpiece against said abrasive cloth;

a top ring drive shaft coupled to said top ring;

a plate interposed between said top ring and said top ring drive shaft, said plate having an annular lower projection, at a lower surface thereof, which contacts the upper surface of said top ring, pressure distribution at the lower surface of said top ring being established by the area over which said lower projection contacts said top ring; and a spherical bearing interposed between said plate and said top ring drive shaft, said spherical bearing comprising spherical seats formed in said plate and in said top ring drive shaft, respectively and a single sphere seated in said seats so as to allow said top ring to tilt upon changes in the inclination of said upper surface of said turntable.

18. The polishing apparatus according to claim 12, wherein said top ring has a plurality of suction holes connected to a vacuum source, whereby the workpiece is attractable to a lower surface of said top ring under a vacuum developed by said vacuum source.

19. The polishing apparatus according to claim 12, wherein said top ring comprises a porous plate connected to a vacuum source, whereby the workpiece is attractable to a lower surface of said porous plate under a vacuum developed by said vacuum source.

20. The polishing apparatus according to claim 12, and further comprising at least one first pin mounted on said top ring drive shaft and at least one second pin mounted on said top ring, said first pin and said second pin being held in point contact with each other such that torque from said top ring drive shaft is transmitted to said top ring via said pins.

21. The polishing apparatus according to claim 1, wherein said turntable has an axis of rotation extending parallel to and spaced from the central longitudinal axis of said top ring drive shaft; and further comprising an abrasive spray nozzle disposed above said turntable and oriented to direct abrasive slurry onto the abrasive cloth at a location spaced radially inwardly of the turntable from the location at which the surface of a workpiece is pressed against the abrasive cloth by said supporting and pressing member.

\* \* \* \* \*